(12) United States Patent
Pendharkar et al.

(10) Patent No.: US 8,309,423 B2
(45) Date of Patent: Nov. 13, 2012

(54) HIGH VOLTAGE DIODE WITH REDUCED SUBSTRATE INJECTION

(75) Inventors: Sameer P. Pendharkar, Allen, TX (US); Binghua Hu, Plano, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 13/409,689

(22) Filed: Mar. 1, 2012

(65) Prior Publication Data

US 2012/0164814 A1 Jun. 28, 2012

Related U.S. Application Data

(62) Division of application No. 12/537,318, filed on Aug. 7, 2009.

(60) Provisional application No. 61/086,860, filed on Aug. 7, 2008.

(51) Int. Cl.
*H01L 29/861* (2006.01)

(52) U.S. Cl. ............. 438/418; 257/E29.012; 257/509; 438/480; 438/380

(58) Field of Classification Search .......... 257/509, 257/E29.012; 438/418, 480, 506, 505, 129, 438/265
See application file for complete search history.

(56) References Cited

U.S. PATENT DOCUMENTS

| 7,348,657 B2* | 3/2008 | Pequignot et al. ............ 257/546 |
| 2008/0044955 A1* | 2/2008 | Salcedo et al. ............... 438/140 |

* cited by examiner

*Primary Examiner* — S. V. Clark
*Assistant Examiner* — Krista Soderholm
(74) *Attorney, Agent, or Firm* — Jacqueline J. Garner; Wade J. Brady, III; Frederick J. Telecky Jr.

(57) ABSTRACT

A high voltage diode in which the n-type cathode is surrounded by an uncontacted heavily doped n-type ring to reflect injected holes back into the cathode region for recombination or collection is disclosed. The dopant density in the heavily doped n-type ring is preferably 100 to 10,000 times the dopant density in the cathode. The heavily doped n-type region will typically connect to an n-type buried layer under the cathode. The heavily doped n-type ring is optimally positioned at least one hole diffusion length from cathode contacts. The disclosed high voltage diode may be integrated into an integrated circuit without adding process steps.

6 Claims, 9 Drawing Sheets

HIGH VOLTAGE DIODE WITH REDUCED SUBSTRATE INJECTION

CROSS REFERENCE TO RELATED APPLICATIONS

This application is a divisional of U.S. Nonprovisional patent application Ser. No. 12/537,318, filed Aug. 7, 2009, and claims the priority of U.S. Provisional application Ser. No. 61/086,860, filed Aug. 7, 2008, the contents of which are herein incorporated by reference in its entirety.

FIELD OF THE INVENTION

This invention relates to the field of integrated circuits. More particularly, this invention relates to high voltage diodes in integrated circuits.

BACKGROUND OF THE INVENTION

High voltage diodes, which are able to operate at greater than 50 volts reverse bias without breaking down, are often included in integrated circuits (ICs). During operation under forward bias, a high voltage diode may undesirably inject a significant current density of majority carriers into the substrate of the IC, interfering with operation of adjacent components in the IC.

SUMMARY OF THE INVENTION

This Summary is provided to comply with 37 C.F.R. §1.73, requiring a summary of the invention briefly indicating the nature and substance of the invention. It is submitted with the understanding that it will not be used to interpret or limit the scope or meaning of the claims.

The instant invention provides a high voltage diode in an integrated circuit (IC) formed of a p-type anode inside an n-type cathode and an uncontacted n-type diffused ring region surrounding the cathode, which has a higher dopant density than the cathode. The dopant density in the uncontacted n-type diffused ring region is preferably 100 to 10,000 times the dopant density in the n-type cathode.

An advantage of the instant invention is a portion of injected hole current from the anode is reflected back to the deep n-well cathode by the uncontacted n-type diffused ring region, thus desirably reducing the amount of injected hole current that diffuses to adjacent components in the IC.

DETAILED DESCRIPTION

Figure 1A:
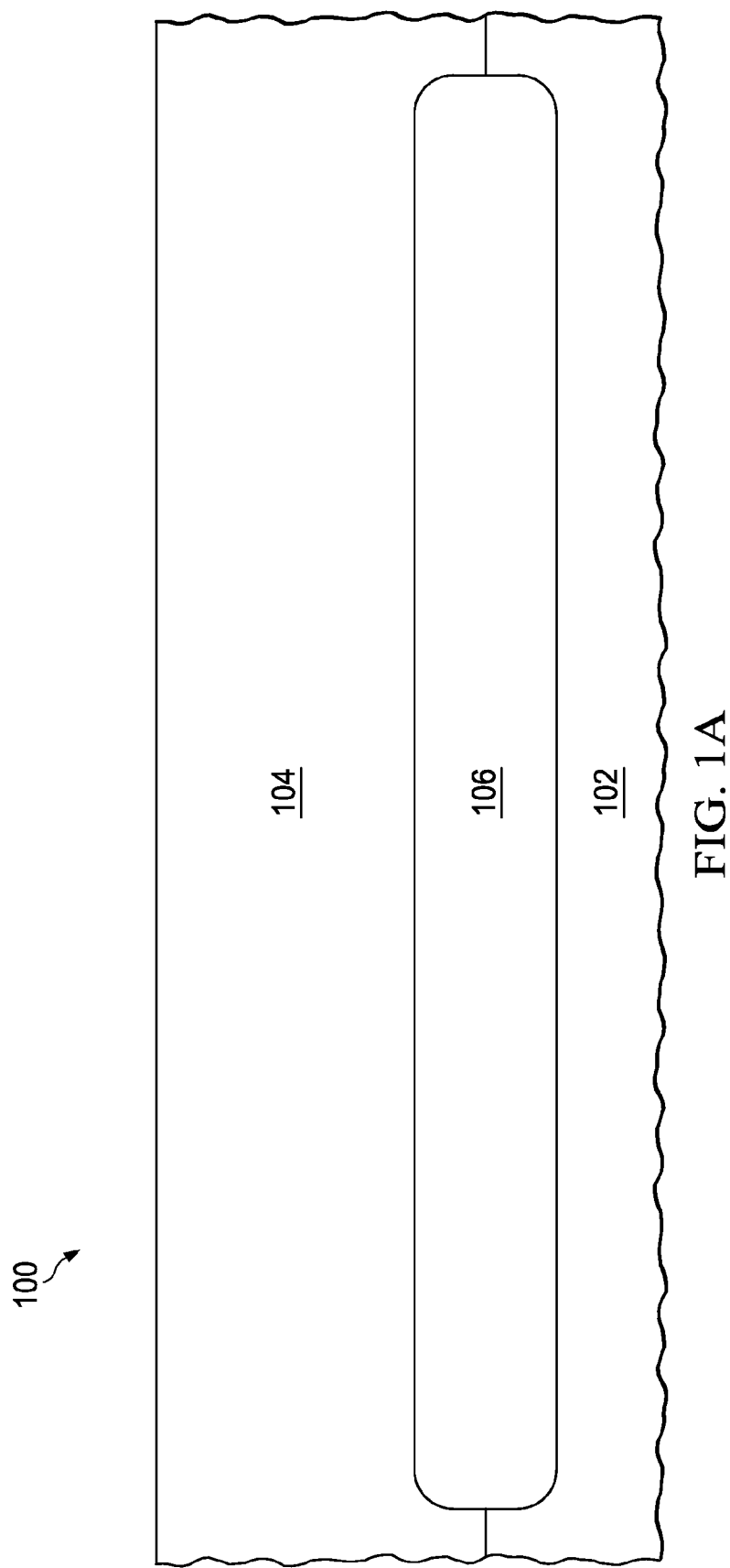
FIG. 1A through FIG. 1H are cross-sections of an IC containing a high voltage diode formed according to a first embodiment of the instant invention, shown in successive stages of fabrication.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

The instant invention provides a high voltage diode in an integrated circuit (IC) formed of a p-type anode inside a deep n-well cathode which includes an uncontacted n-type diffused ring region with a higher dopant density than the deep n-well cathode on a lateral boundary of the deep n-well cathode. The uncontacted n-type ring reflects a portion of injected hole current from the anode back to the deep n-well cathode, thus desirably reducing the amount of injected hole current that diffuses to adjacent components in the IC. An advantage of the instant invention is that the floating n-type diffused ring may be integrated into the IC without adding process cost or complexity.

FIG. 1A through FIG. 1H are cross-sections of an IC containing a high voltage diode formed according to a first embodiment of the instant invention, shown in successive stages of fabrication. Referring to FIG. 1A, the IC (100) is formed on a p-type substrate (102), typically a single crystal silicon wafer, commonly with an electrical resistivity between 0.001 and 1 ohm-cm. A p-type epitaxial layer (104) is formed on a top surface of the substrate (102), typically by known vapor phase epitaxial growth methods. The p-type epitaxial layer (104) is typically between 3 and 9 microns thick, and typically has an electrical resistivity between 1 and 100 ohm-cm. An n-type buried layer (106) is formed at an interface between the substrate (102) and the p-type epitaxial layer (104) in a region for the inventive high voltage diode by known processes, including ion implantation of a first set of n-type dopants, typically antimony, but possibly including arsenic, at a total dose between $1·10^{14}$ and $1·10^{17}$ atoms/cm$^2$, through an n-type buried layer implant mask into a region at the top surface of the substrate (102) defined for the n-type buried layer before the p-type epitaxial layer (104) is formed, followed by a thermal operation which repairs damage to a crystal lattice of the substrate (102), and followed by growth of the p-type epitaxial layer (104). The n-type buried layer (106) commonly has a thickness of 1 to 3 microns and a dopant density between $5·10^{17}$ and $3·10^{20}$ atoms/cm$^2$, resulting in a sheet resistivity between 1 and 100 ohms/square.

Figure 1B:
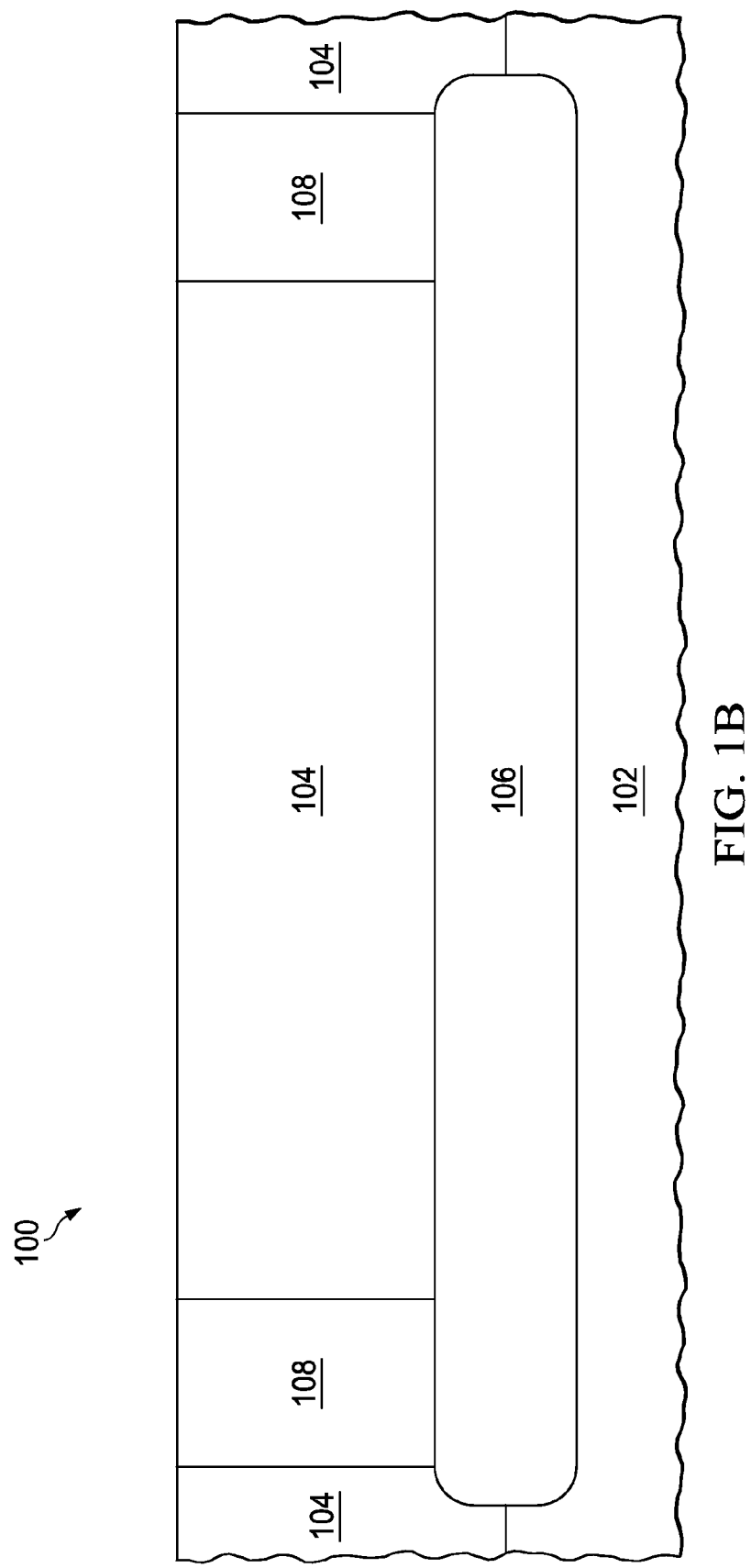

FIG. 1B depicts the IC (100) after formation of an uncontacted n-type diffused ring region (108). In the instant embodiment, the uncontacted n-type diffused ring region (108) is formed of deep n-type diffused regions (108), commonly known as sinkers, in the p-type epitaxial layer (104) adjacent to a lateral boundary of the n-type buried layer (106), typically by ion implanting a second set of n-type dopants, including phosphorus, and possibly arsenic, at a total dose between $1·10^{15}$ and $1·10^{17}$ atoms/cm$^2$, at one or more energies between 50 and 500 keV, followed by an n-sinker drive operation in which the IC (100) is heated higher than 1000 C. for longer than 60 minutes, resulting in an n-type region with an average dopant density between $2·10^{18}$ and $2·10^{20}$ atoms/cm$^3$, extending from a top surface of the substrate (102) to the n-type buried layer (106). The n-type sinker regions (108) are joined at locations out of the plane of FIG. 1B, so as to laterally surround and electrically isolate a region of the p-type epitaxial layer (104) over the n-type buried layer (106). Other methods of forming the uncontacted n-type diffused ring region are within the scope of the instant embodiment.

Figure 1C:
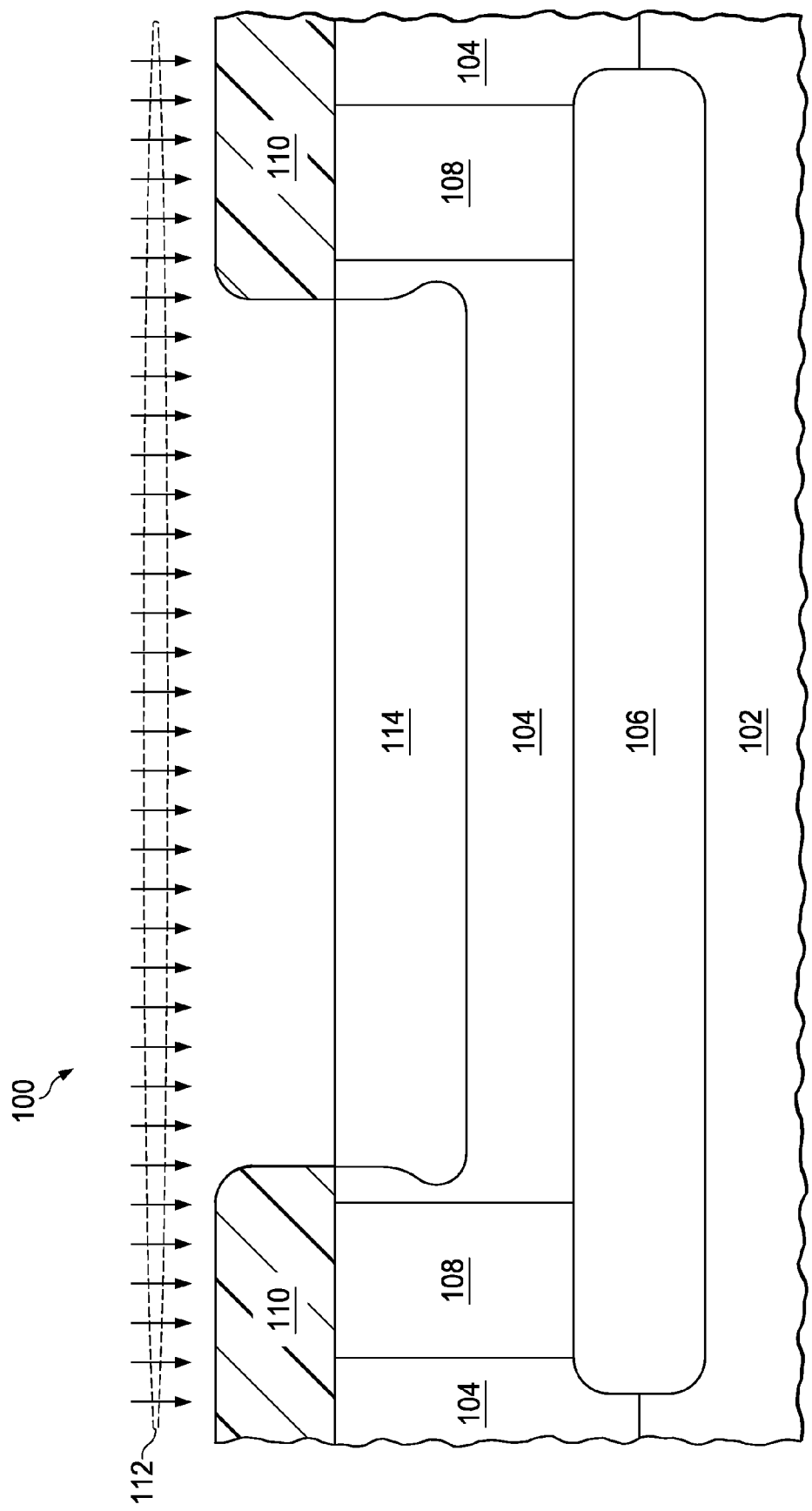

FIG. 1C depicts the IC (100) during an ion implantation operation to form a deep n-well cathode. A deep n-well cathode photoresist pattern (110) is formed on the top surface of the p-type epitaxial layer (104) using known photolithographic methods to define a region for a deep n-well cathode implant. A third set of n-type dopants (112), including phosphorus and arsenic, and possibly antimony, are ion implanted at a total dose between $1 \cdot 10^{12}$ and $3 \cdot 10^{13}$ atoms/cm$^2$, at one or more energies between 50 and 3000 keV, into the p-type epitaxial layer (104) in the region defined for the deep n-well cathode implant to form a deep n-well cathode implanted region (114). The third set of n-type dopants (112) is blocked from the p-type epitaxial layer (104) outside the region defined for the deep n-well cathode implant by the deep n-well cathode photoresist pattern (110). The deep n-well cathode photoresist pattern (110) is removed after the deep n-well cathode implant operation, commonly by exposing the IC (100) to an oxygen containing plasma, followed by a wet cleanup to remove any organic residue from the top surface of the p-type epitaxial layer (104).

Figure 1D:
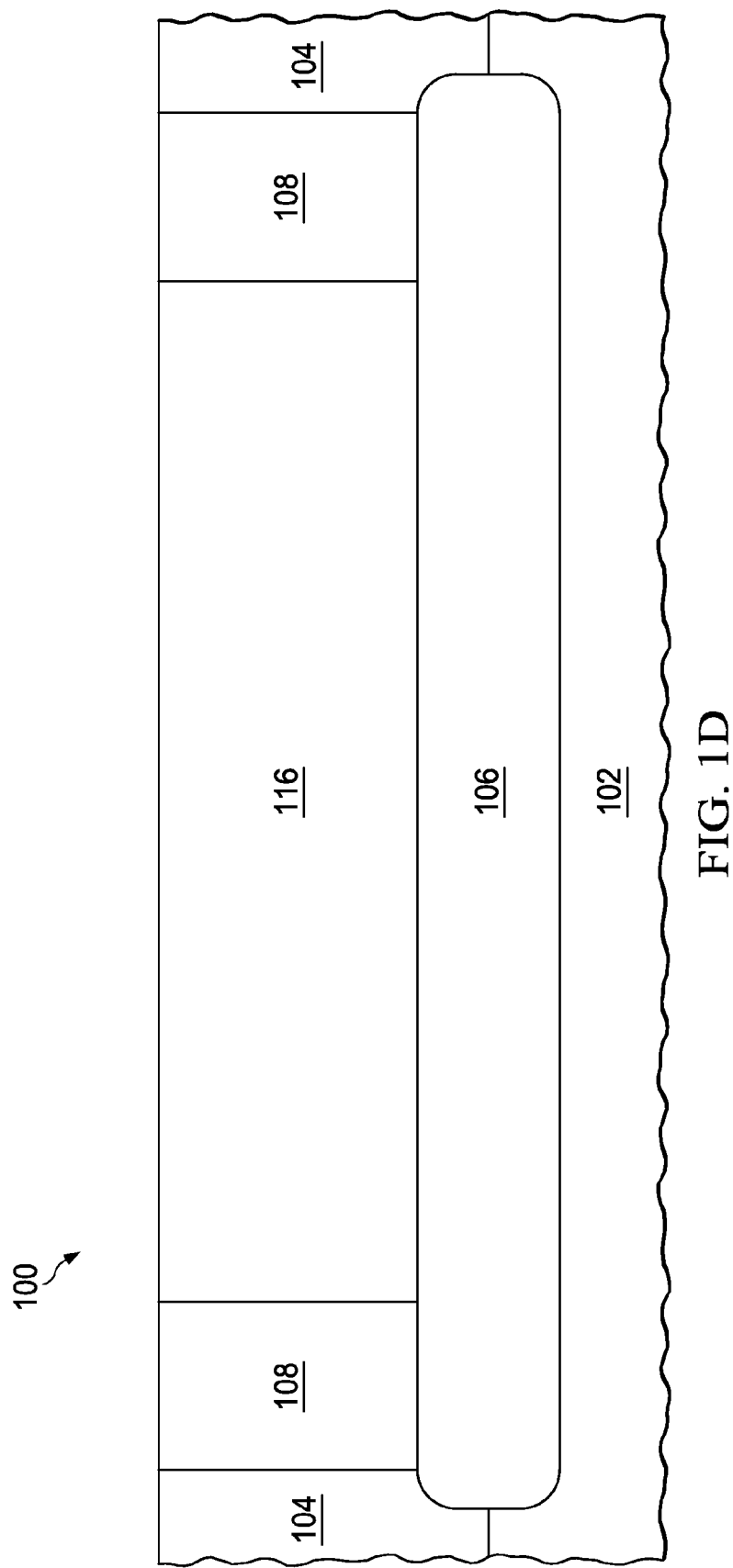

FIG. 1D depicts the IC (100) after a deep n-well cathode drive operation which diffuses and activates the third set of n-type dopants in the deep n-well cathode implanted region throughout the region of the p-type epitaxial layer (104) over the n-type buried layer (106) to form a deep n-well cathode (116). The deep n-well cathode drive operation is commonly performed at a temperature higher than 1000 C. for longer than 60 minutes. The deep n-well cathode (116) has an average dopant density between $3 \cdot 10^{15}$ and $2 \cdot 10^{17}$ atoms/cm$^3$, extending from a top surface of the p-type epitaxial layer (104) to the n-type buried layer (106).

It is common to perform the n-sinker drive operation, if performed, and the deep n-well cathode drive operation as one operation. It is within the scope of the instant invention to form the n-type buried layer (106), the uncontacted n-type diffused ring region (108) and the deep n-well cathode (116) by any means which produces the configuration described above in reference to FIG. 1A through FIG. 1D, such that the average dopant density in the uncontacted n-type diffused ring region (108) is 100 to 10,000 times higher than the average dopant density in the deep n-well cathode (116).

Figure 1E:
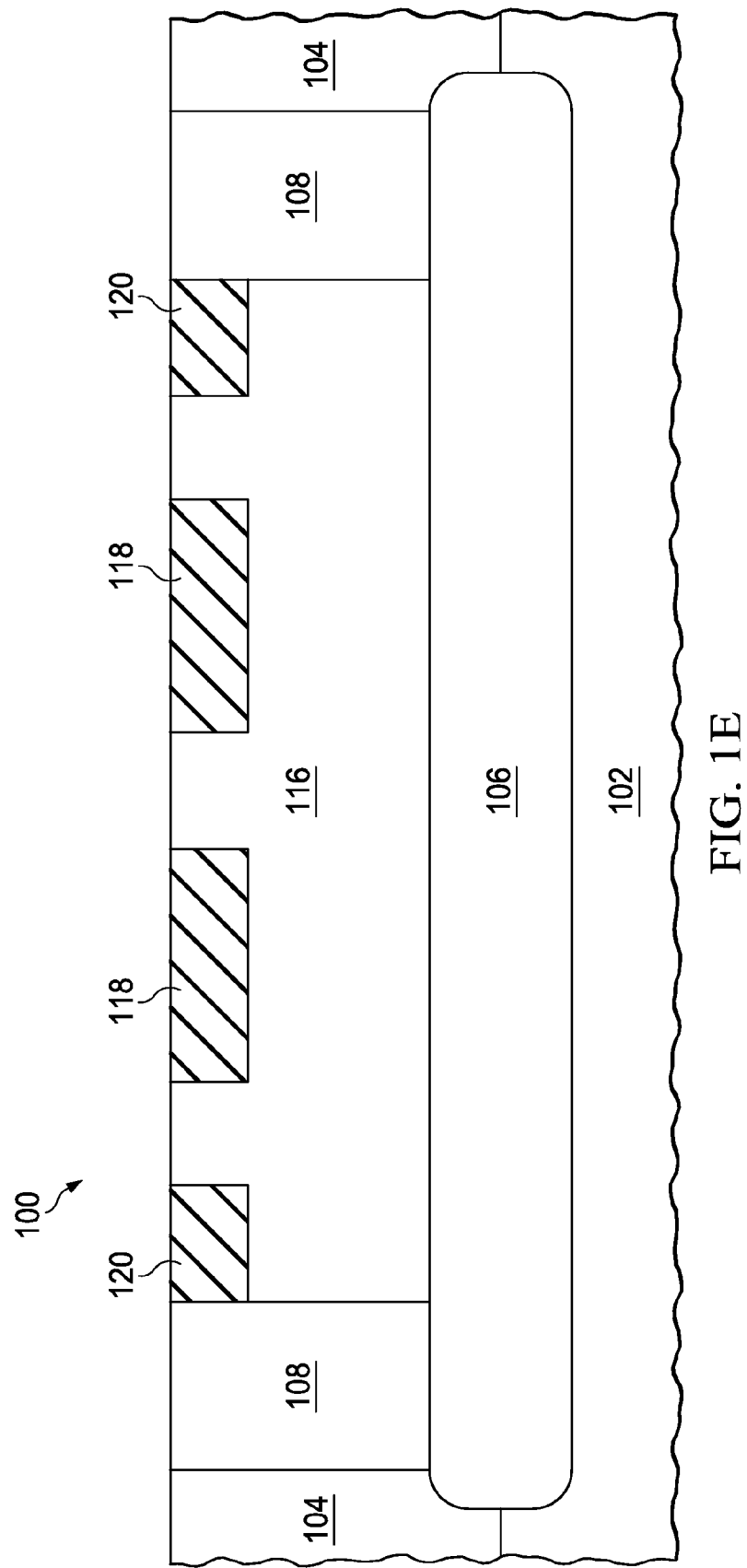

FIG. 1E depicts the IC (100) after formation of field oxide elements, at top surfaces of the p-type epitaxial layer (104) and deep n-well cathode (116), typically of silicon dioxide between 250 and 600 nanometers thick, commonly by shallow trench isolation (STI) or local oxidation of silicon (LOCOS) processes. In STI processes, silicon dioxide may be deposited by high density plasma (HDP) or high aspect ratio process (HARP). A first set of field oxide elements (118) is formed over the deep n-well cathode (116) to electrically isolate an anode region from cathode regions of the high voltage diode at the top surface of the deep n-well cathode (116). An optional second set of field oxide elements (120) may be formed over an outer region of the deep n-well cathode (116), and may optionally extend over the uncontacted n-type diffused ring region (108).

Figure 1F:
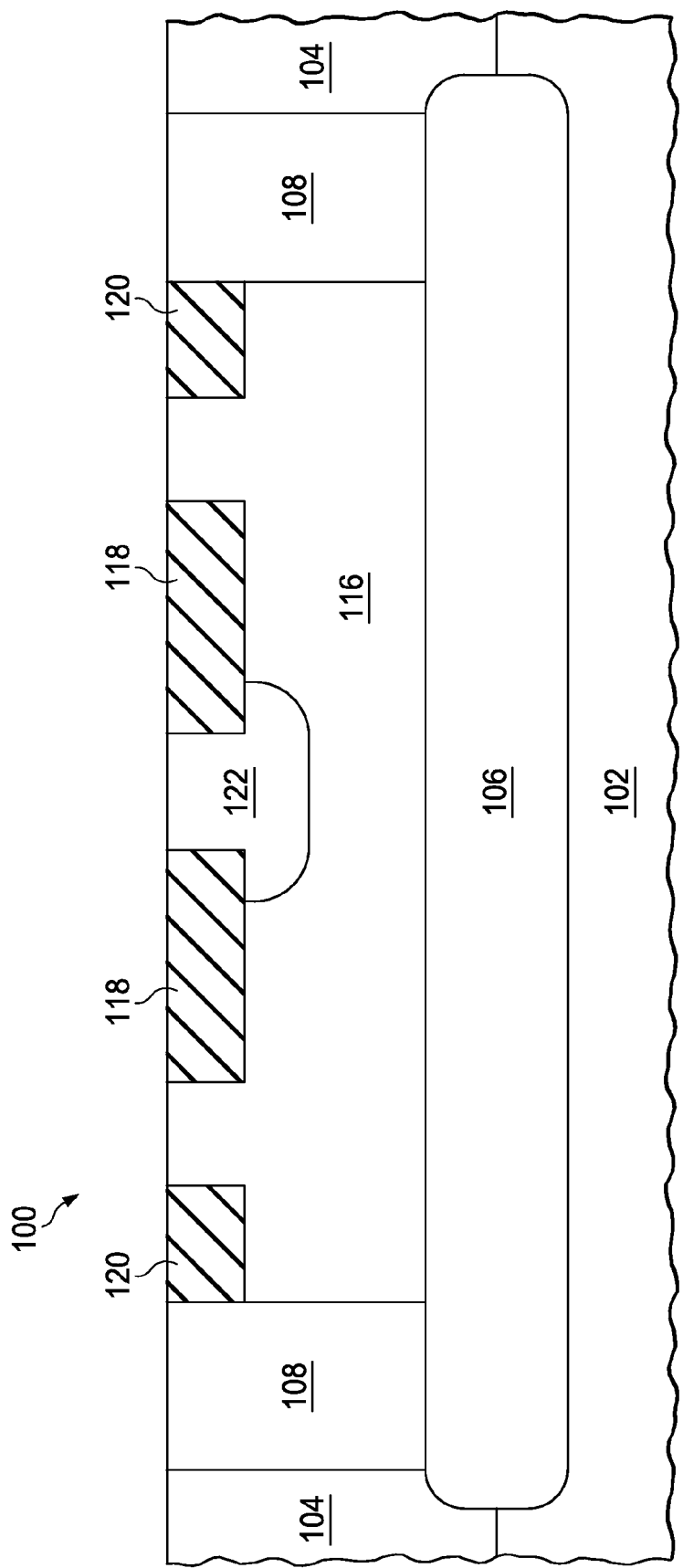

FIG. 1F depicts the IC (100) after formation of a shallow p-well anode (122) in the deep n-well cathode (116) under an opening in the first set of field oxide elements (118), typically by ion implanting a first set of p-type dopants, including boron and possibly gallium and/or indium, at doses from $1 \cdot 10^{11}$ to $1 \cdot 10^{14}$ atoms/cm$^2$, into a region defined for a shallow p-well. A p-well photoresist pattern, not shown in FIG. 1E for clarity, is commonly used to block the first set of p-type dopants from areas outside the p-well region. The shallow p-well anode (122) extends from a top surface of the deep n-well cathode (116) to a depth typically 250 to 1500 nanometers below a bottom surface of the field oxide elements (122). The ion implantation process to form the shallow p-well anode (122) may include additional steps to implant additional p-type dopants at shallower depths for purposes of improving n-channel metal oxide semiconductor (NMOS) transistor performance, such as threshold adjustment, leakage current reduction and suppression of parasitic bipolar operation.

Figure 1G:
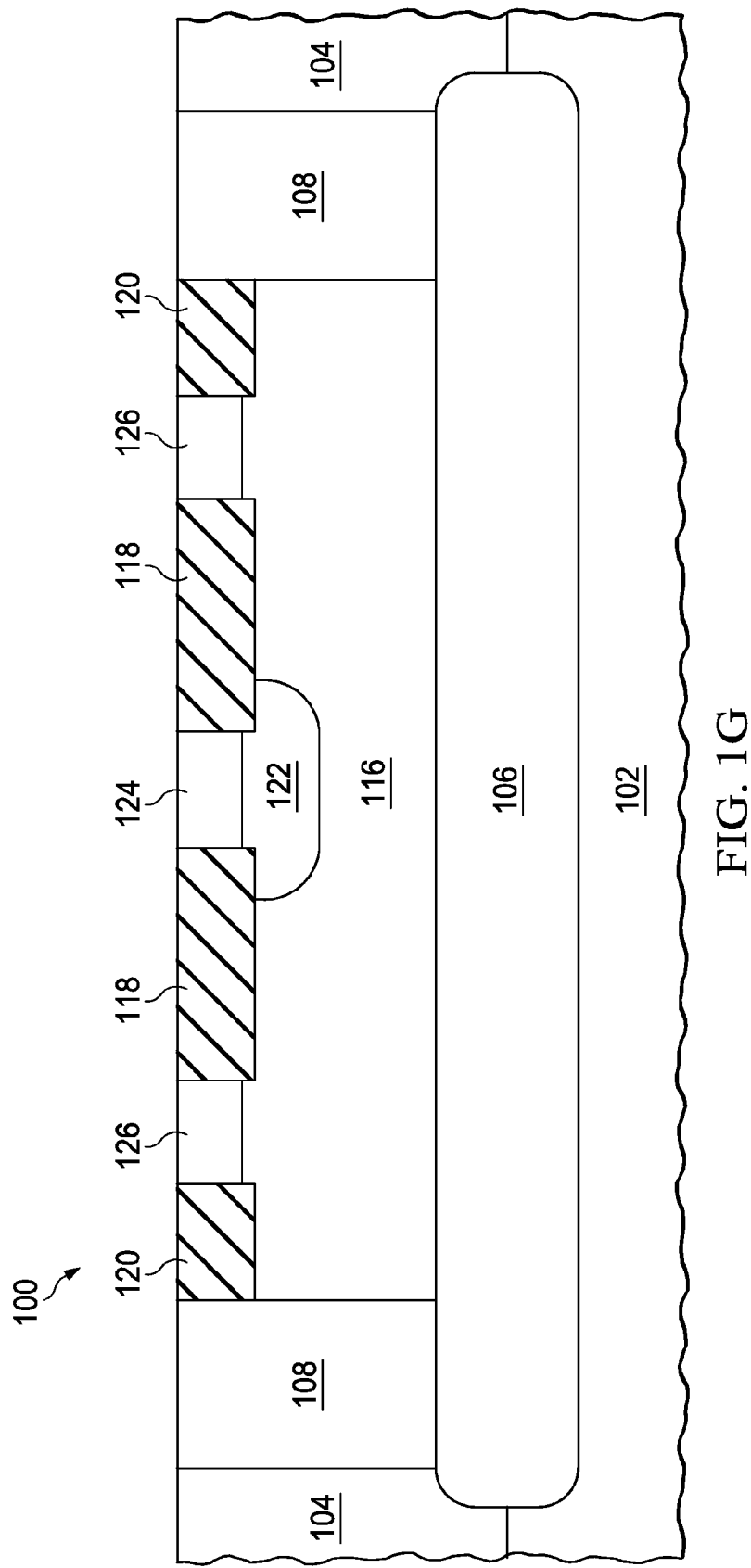

FIG. 1G depicts the IC (100) after formation of a p-type anode contact region (124) at a top surface of the shallow p-well anode (122) and n-type cathode contact regions (126) at the top surface of the deep n-well cathode (116). The p-type anode contact region (124) is typically formed by ion implanting a second set of p-type dopants, including boron, commonly in the form BF$_2$, and possibly gallium and/or indium, at a total dose between $3 \cdot 10^{13}$ and $1 \cdot 10^{16}$ atoms/cm$^2$, into areas defined for the p-type anode contact region (124). An anode contact photoresist pattern, not shown in FIG. 1G for clarity, is commonly used to block the second set of p-type dopants from areas outside the anode contact region. The p-type anode contact region (124) typically extends from the top surface of the shallow p-well anode (122) to a depth between 50 and 500 nanometers. Similarly, the n-type cathode contact regions (126) are typically formed by ion implanting a fourth set of n-type dopants, including phosphorus and arsenic, and possibly antimony, at a total dose between $3 \cdot 10^{13}$ and $1 \cdot 10^{16}$ atoms/cm$^2$, into areas defined for the n-type cathode contact regions (126). A cathode contact photoresist pattern, not shown in FIG. 1G for clarity, is commonly used to block the fourth set of n-type dopants from areas outside the cathode contact regions. The n-type cathode contact regions (126) typically extend from the top surface of the deep n-well cathode (116) to a depth between 50 and 500 nanometers. It is within the scope of the instant invention to form the p-type anode contact region (124) and the n-type cathode contact regions (126) in any order.

A lateral separation between the shallow p-well anode (122) and the n-type cathode contact regions (126) is typically established by a maximum operating voltage of the high voltage diode. For example, a high voltage diode that is designed to operate at 80 volts may have a lateral separation of 3 to 4 microns between the shallow p-well anode (122) and the n-type cathode contact regions (126). A lateral separation between the n-type cathode contact regions (126) and the uncontacted n-type diffused ring region (108) is preferably greater than a diffusion length of positive charge carriers, commonly known as holes, in the deep n-well cathode (116), which is commonly greater than 5 microns.

Figure 1H:
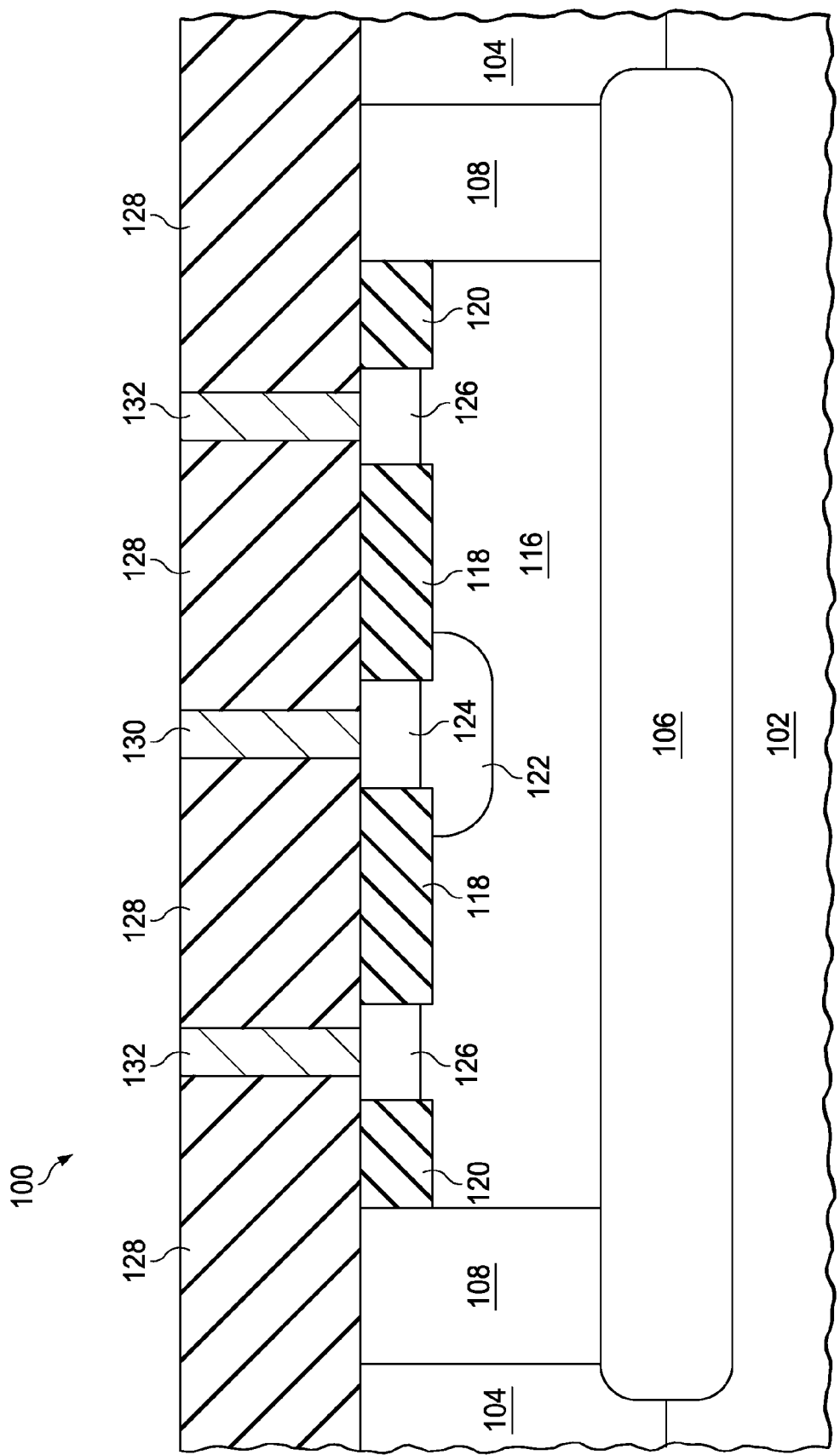

FIG. 1H depicts the IC (100) after formation of a first level of interconnect elements. A pre-metal dielectric layer (PMD) (128), typically a dielectric layer stack including a silicon nitride or silicon dioxide PMD liner 10 to 100 nanometers thick deposited by plasma enhanced chemical vapor deposition (PECVD), a layer of silicon dioxide, phospho-silicate glass (PSG) or boro-phospho-silicate glass (BPSG), commonly 100 to 1000 nanometers thick deposited by PECVD, commonly leveled by a chemical-mechanical polish (CMP) process, and an optional PMD cap layer, commonly 10 to 100 nanometers of a hard material such as silicon nitride, silicon carbide nitride or silicon carbide is formed on top surfaces of the first and second sets of field oxide elements (118, 120), the p-type anode contact region (124) and the n-type cathode contact regions (126).

Still referring to FIG. 1H, an anode contact (130) and cathode contacts (132) are formed in the PMD (128) to make electrical connections to the p-type anode contact region (124) and the n-type cathode contact regions (126), respectively. The contacts (130, 132) are typically formed by defining contact regions on a top surface of the PMD (128) with a contact photoresist pattern, not shown in FIG. 1H for clarity, removing PMD material from the contact regions using known etching methods to expose the p-type anode contact region (124) and the n-type cathode contact regions (126), and filling the contact regions with contact metal, typically tungsten. Contacts are not formed on the uncontacted n-type diffused ring region (108), leaving the uncontacted n-type diffused ring region (108) free of electrical connections to other components in the IC (100).

During operation of the high voltage diode formed according to the instant embodiment, holes are injected from the shallow p-well anode region (122) into the deep n-well cathode (116). The higher average dopant density in the uncontacted n-type diffused ring region (108) compared to the average dopant density in the deep n-well cathode (116), combined with placement of the n-type cathode contact regions (126) over the deep n-well cathode (116) results in holes being desirably reflected from the uncontacted n-type diffused ring region (108) back into the deep n-well cathode (116), where the holes recombine with electrons or are collected at the n-type cathode contact regions (126). The configuration of the n-sinker regions (108) surrounding the deep n-well cathode (116) desirably reduces hole current from the shallow p-well anode region (122) injected into the p-type epitaxial layer (104) and substrate (102).

Figure 2:
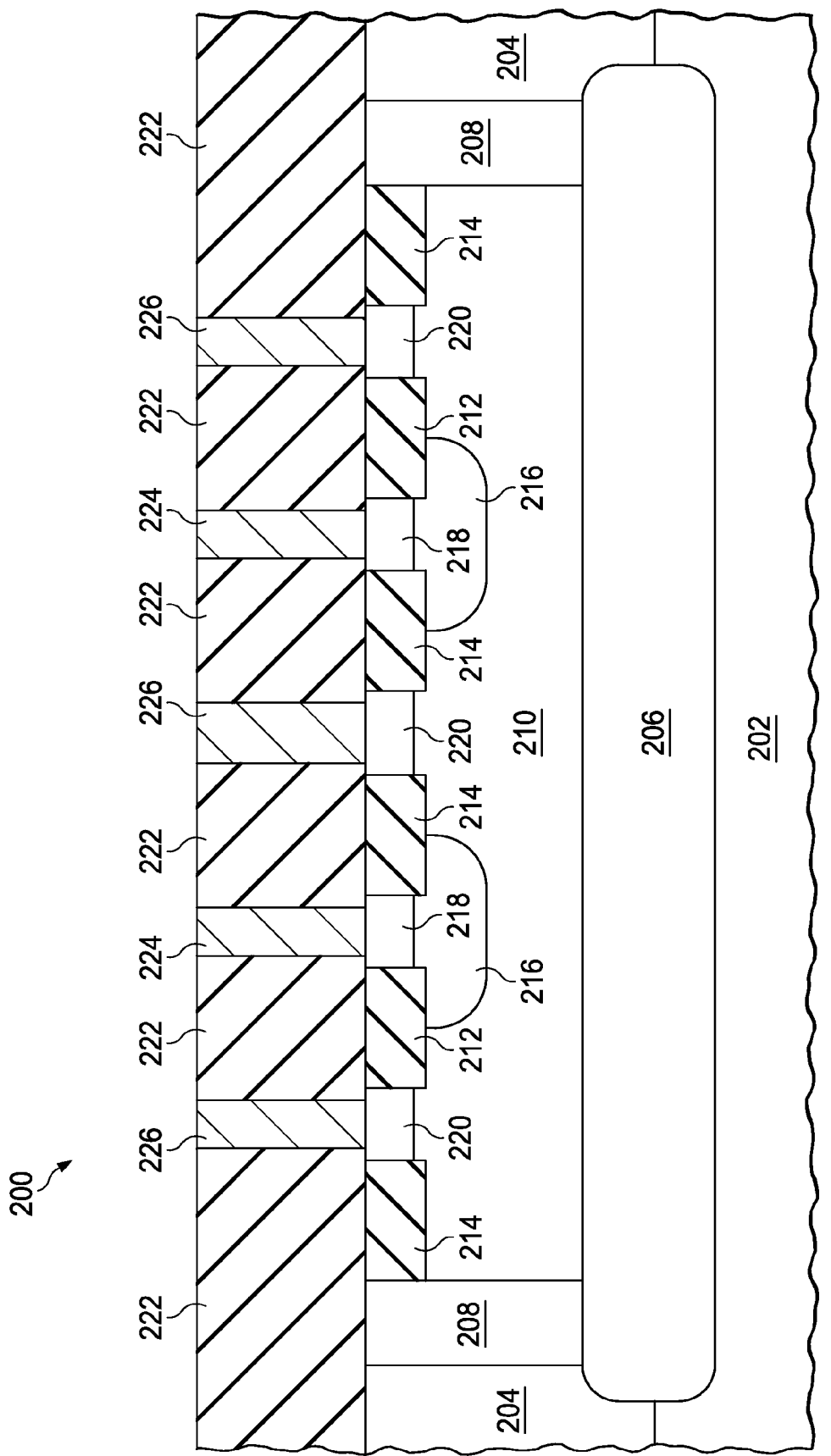
FIG. 2 is a cross-section of an IC containing a high voltage diode with multiple anode fingers formed according to a second embodiment of the instant invention.

FIG. 2 is a cross-section of an IC containing a high voltage diode with multiple anode fingers formed according to a second embodiment of the instant invention. The IC (200) is formed on a p-type substrate (202) with the properties described above in reference to FIG. 1A. A p-type epitaxial layer (204) with the properties described above in reference to FIG. 1A is formed on a top surface of the substrate (202). An n-type buried layer (206) is formed at an interface between the substrate (202) and the p-type epitaxial layer (204) in a region for the inventive high voltage diode, as described above in reference to FIG. 1A. An uncontacted n-type diffused ring region (208), extending from a top surface of the p-type epitaxial layer (204) to the n-type buried layer (206), are formed as described above in reference to FIG. 1B, so as to laterally surround and electrically isolate a region of the p-type epitaxial layer (204) over the n-type buried layer (206). A deep n-well cathode (210) is formed in the p-type epitaxial layer (204) above the n-type buried layer (206), as described above in reference to FIG. 1C and FIG. 1D. An average dopant density in the uncontacted n-type diffused ring region (208) is 100 to 10,000 times higher than the average dopant density in the deep n-well cathode (210). A first set of field oxide elements (212) is formed over the deep n-well cathode (210) to electrically isolate anode regions from cathode regions of the high voltage diode at the top surface of the deep n-well cathode (210). An optional second set of field oxide elements (214) may be formed in a contiguous ring over an outer region of the deep n-well cathode (210), as described above in reference to FIG. 1E. Shallow p-well anodes (216) are formed under openings in the first set of field oxide elements (212), as described above in reference to FIG. 1F. P-type anode contact regions (218) are formed at top surfaces of the shallow p-well anodes (216), as described above in reference to FIG. 1G. N-type cathode contact regions (220) are formed at the top surface of the deep n-well cathode (210) in openings in the first set of field oxide elements (212), as described above in reference to FIG. 1G. Lateral separations between the shallow p-well anodes (216) and adjacent n-type cathode contact regions (220) are typically established by a maximum operating voltage of the high voltage diode, as discussed above in reference to FIG. 1G. Minimum lateral separations between n-type cathode contact regions (220) and the uncontacted n-type diffused ring region (208) is preferably greater than a diffusion length of holes in the deep n-well cathode (210), as discussed above in reference to FIG. 1G. A PMD layer (222) is formed on top surfaces of the first and second sets of field oxide elements (212, 214), the p-type anode contact region (218) and the n-type cathode contact regions (220), as described above in reference to FIG. 1H. Anode contacts (224) and cathode contacts (226) are formed in the PMD (222) to make electrical connections to the p-type anode contact regions (218) and the n-type cathode contact regions (220), respectively, as described above in reference to FIG. 1H.

During operation of the high voltage diode formed according to the instant embodiment, holes are injected from the shallow p-well anode regions (216) into the deep n-well cathode (210). The higher average dopant density in the uncontacted n-type diffused ring region (208) compared to the average dopant density in the deep n-well cathode (210), combined with placement of the n-type cathode contact regions (220) over the deep n-well cathode (210) results in holes being desirably reflected from the uncontacted n-type diffused ring region (208) back into the deep n-well cathode (210), where the holes recombine with electrons or are collected at the n-type cathode contact regions (220). The configuration of the uncontacted n-type diffused ring region (208) surrounding the deep n-well cathode (210) desirably reduces hole current from the shallow p-well anode regions (216) injected into the p-type epitaxial layer (204) and substrate (202). The configuration of multiple shallow p-well anode regions (216) in the deep n-well cathode (210) desirably increases a current capacity of the high voltage diode formed according to the instant embodiment.

What is claimed is:

1. A method of forming an integrated circuit, comprising the steps of:
    providing a p-type substrate;
    forming a p-type epitaxial layer on a top surface of said p-type substrate; and
    forming a high voltage diode by a process further comprising the steps of:
        forming a deep n-well cathode in said p-type epitaxial layer by ion implanting a first set of n-type dopants into said p-type epitaxial layer;
        forming an uncontacted n-type diffused ring region in said p-type epitaxial layer surrounding said deep n-well cathode by ion implanting a second set of n-type dopants into said p-type epitaxial layer, such that an average dopant density of said uncontacted n-type diffused ring region is higher than an average dopant density of said deep n-well cathode; and
        forming cathode contacts on said deep n-well cathode.

2. The method of claim 1, further comprising the step of forming an n-type buried layer under, and in contact with, said deep n-well cathode, at an interface between said p-type substrate and said p-type epitaxial layer, by ion implanting a third set of n-type dopants into said p-type substrate, such that an average dopant density of said n-type buried layer is higher than an average dopant density of said deep n-well cathode.

3. The method of claim 2, wherein said average dopant density of said uncontacted n-type diffused ring region is between 100 and 10,000 times average dopant density of said deep n-well cathode.

4. The method of claim 3, wherein a lateral separation between said uncontacted n-type diffused ring region and an n-type contact region of said deep n-well cathode is greater than 5 microns.

5. The method of claim 4, further comprising the steps of:
  forming a p-well anode in said deep n-well cathode by ion implanting a first set of p-type dopants into said deep n-well cathode;
  forming a p-type anode contact region in said p-well anode;
  forming n-type cathode contact regions in said deep n-well cathode;
  forming a pre-metal dielectric layer on a top surface of said deep n-well cathode;
  forming an anode contact in said pre-metal dielectric layer whereby said anode contact is connected to said p-type anode contact region; and
  forming n-type cathode contact regions in said deep n-well cathode whereby said cathode contacts are connected to said n-type cathode contact regions.

6. The method of claim 5, in which said step of forming a p-well anode further comprises the step of ion implanting said first set of p-type dopants into a plurality of separate p-type well regions in said deep n-well cathode.

* * * * *